US010447289B1

(12) United States Patent
Shikata et al.

(10) Patent No.: US 10,447,289 B1
(45) Date of Patent: Oct. 15, 2019

(54) ANALOG-TO-DIGITAL CONVERTER NOISE REDUCTION TECHNIQUES

(71) Applicant: Analog Devices, Inc., Norwood, MA (US)

(72) Inventors: Akira Shikata, Everett, MA (US); Junhua Shen, Wilmington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/009,923

(22) Filed: Jun. 15, 2018

(51) Int. Cl.
*H03M 1/06* (2006.01)
*H03M 1/08* (2006.01)
*H03M 1/00* (2006.01)

(52) U.S. Cl.
CPC ............. *H03M 1/08* (2013.01); *H03M 1/002* (2013.01)

(58) Field of Classification Search
CPC ............................... H03M 1/18; H03M 1/002
USPC ................. 341/144, 155, 163, 172, 118, 156
See application file for complete search history.

(56) References Cited

U.S. PATENT DOCUMENTS

| 6,894,627 | B2 | 5/2005 | Janakiraman et al. |
|---|---|---|---|
| 6,958,722 | B1 | 10/2005 | Janakiraman et al. |
| 6,980,144 | B1 | 12/2005 | Maloberti et al. |
| 7,218,259 | B2 | 5/2007 | Hurrell et al. |
| 8,766,839 | B2 | 7/2014 | Janakiraman et al. |
| 8,896,476 | B2 | 11/2014 | Harpe |
| 9,154,152 | B1 | 10/2015 | Chiu et al. |
| 9,362,939 | B1 | 6/2016 | Rath et al. |
| 9,673,832 | B2 | 6/2017 | Tsai |
| 2008/0084340 | A1* | 4/2008 | Hurrell ............... H03M 1/0641 341/131 |
| 2011/0115658 | A1* | 5/2011 | Carreau .................. H03M 1/14 341/118 |
| 2014/0253223 | A1 | 9/2014 | Meehan et al. |
| 2015/0091744 | A1 | 4/2015 | Shen et al. |
| 2017/0126239 | A1 | 5/2017 | Sun et al. |
| 2017/0250702 | A1 | 8/2017 | Venca et al. |

FOREIGN PATENT DOCUMENTS

| EP | 2102986 | 8/2011 |
|---|---|---|
| WO | WO-2009134734 A2 | 11/2009 |
| WO | WO-2017058874 | 4/2017 |

OTHER PUBLICATIONS

Chen, Long, et al., "A 0.7-V 0.6-μW 100-kS/s Low-Power SAR ADC with Statistical Estimation-Based Noise Reduction", IEEE Journal of Solid-state Circuits, (2017), 11 pages.

(Continued)

*Primary Examiner* — Peguy Jean Pierre
(74) *Attorney, Agent, or Firm* — Schwegman Lundberg & Woessner, P.A.

(57) ABSTRACT

Improvements in analog-to-digital converter (ADC) circuit accuracy are described that can utilize a digital-to-analog converter (DAC) circuit with one or more redundant unit elements, or one or more bits redundancy or non-binary weighted capacitors, and can reuse the existing DAC circuit for noise reduction to save power and die area. An ADC circuit can use redundancy bit(s), e.g., one or more DAC unit elements of a main DAC, and the remaining lower bits of the main DAC for repeated bit trials, and can average the data from the repeated bit trials to suppress noise from conversions.

23 Claims, 6 Drawing Sheets

(56) References Cited

OTHER PUBLICATIONS

Chen, Long, et al., "A 10.5-b ENOB 645nW 100kS/s SAR ADC with Statistical Estimation Based Noise Reduction", IEEE Custom Integrated Circuits Conference (CICC), San Jose, CA, (2015), 4 pages.

Fiorenza, John K., et al., "Comparator-Based Switched-Capacitor Circuits for Scaled CMOS Technologies", IEEE Journal of Solid-State Circuits, vol. 41, No. 12, (Dec. 2006), 2658-2667.

Margala, Martin, et al., "1.8V 0.18μm CMOS Novel Successive Approximation ADC with Variable Sampling Rate", International Conference on Very Large Scale Integration of System-on-Chip, Darmstadt, Germany, Source: The University of Rochester http://www2.ece.rochester.edu/~diduck/, (Dec. 1, 2003), 5 pages.

\* cited by examiner

| | D6 | D5 | D4 | D3 | D2 | D1 | D0 |
|---|---|---|---|---|---|---|---|
| 518 | 1 | 0 | 0 | 0 | 0 | 0 | 0 |
| 520 | $D_1 6$ | 1 | 0 | 0 | 0 | 0 | 0 |
| 522 | $D_1 6$ | $D_1 5$ | 1 | 0 | 0 | 0 | 0 |
| 524 | $D_1 6$ | $D_1 5$ | $D_1 4$ | 1 | 0 | 0 | 0 |
| 526 | $D_1 6$ | $D_1 5$ | $D_1 4$ | $D_1 3$ | 1 | 0 | 0 |
| 528 | $D_1 6$ | $D_1 5$ | $D_1 4$ | $D_1 3$ | $D_1 2$ | 1 | 0 |
| 530 | $D_1 6$ | $D_1 5$ | $D_1 4$ | $D_1 3$ | $D_1 2$ | $D_1 1$ | 1 |
| 532 | $D_1 6$ | $D_1 5$ | $D_1 4$ | $D_1 3$ | $D_1 2$ | $D_1 1$ | $D_1 0$ |
| 534 | $D_1 6$ | $D_1 5$ | $D_1 4$ | $D_1 3$ | 1 | 0 | 0 |
| 536 | $D_1 6$ | $D_1 5$ | $D_1 4$ | $D_1 3$ | $D_2 2$ | 1 | 0 |
| 538 | $D_1 6$ | $D_1 5$ | $D_1 4$ | $D_1 3$ | $D_2 2$ | $D_2 1$ | 1 |
| 540 | $D_1 6$ | $D_1 5$ | $D_1 4$ | $D_1 3$ | $D_2 2$ | $D_2 1$ | $D_2 0$ |

FIG. 5

ANALOG-TO-DIGITAL CONVERTER NOISE REDUCTION TECHNIQUES

FIELD OF THE DISCLOSURE

This document pertains generally, but not by way of limitation, to integrated circuits, and more particularly, to analog to digital converter circuits and systems.

BACKGROUND

In many electronics applications, an analog input signal is converted to a digital output signal (e.g., for further digital signal processing). For instance, in precision measurement systems, electronics are provided with one or more sensors to make measurements, and these sensors can generate an analog signal. The analog signal can then be provided to an analog-to-digital converter (ADC) circuit as input to generate a digital output signal for further processing. In another instance, in a mobile device receiver, an antenna can generate an analog signal based on the electromagnetic waves carrying information/signals in the air. The analog signal generated by the antenna can then be provided as input to an ADC to generate a digital output signal for further processing.

SUMMARY OF THE DISCLOSURE

Improvements in analog-to-digital converter (ADC) circuit accuracy are described that can utilize a digital-to-analog converter (DAC) circuit with one or more redundant unit elements, or one or more bits redundancy or non-binary weighted capacitors, and can reuse the existing DAC circuit for noise reduction to save power and die area. An ADC circuit can use a portion of the DAC circuit, e.g., redundancy bit(s) and the remaining lower bits or non-binary weighted bits, for repeated bit trials, and can average the data from the repeated bit trials to suppress noise from conversions.

In some aspects, this disclosure is directed to a method of operating an analog-to-digital converter (ADC) circuit to reduce noise. The method comprises acquiring a sample of an analog input signal onto a capacitive digital-to-analog converter (DAC) circuit, wherein the DAC circuit includes weighted capacitors representing most significant bits (MSBs) and least significant bits (LSBs), and wherein the weighted LSB capacitors include at least one redundant capacitor or non-binary weighted capacitor; using the DAC circuit, performing a number M of bit-trials to convert the sample into an N-bit representation; using at least some of the weighted LSB capacitors of the DAC circuit including the at least one redundant capacitor or non-binary weighted capacitor, performing weighted averaging on a repeated number L of trials, where L is less than M; and generating an N-bit digital output.

In some aspects, this disclosure is directed to an analog-to-digital converter (ADC) circuit for reducing noise. The circuit comprises a digital-to-analog converter circuit (DAC) configured to sample an analog input signal, wherein the DAC circuit includes weighted capacitors representing most significant bits (MSBs) and least significant bits (LSBs), and wherein the weighted LSB capacitors include at least one redundant capacitor or non-binary weighted capacitor; and control circuitry configured to: perform a number M of bit-trials to convert the sample into an N-bit representation; using at least some of the LSB capacitors of the DAC circuit, perform weighted averaging on a repeated number L of trials, where L is less than M; and generate an N-bit digital output.

In some aspects, this disclosure is directed to an analog-to-digital converter (ADC) circuit for reducing noise. The circuit comprising a digital-to-analog converter circuit (DAC) configured to sample an analog input signal, wherein the DAC circuit includes weighted capacitors representing most significant bits (MSBs) and least significant bits (LSBs), and wherein the weighted LSB capacitors include at least one redundant capacitor or non-binary weighted capacitor; means for performing a number M of bit-trials to convert the sample into an N-bit representation; using at least some of the LSB capacitors of the DAC circuit including the at least one redundant capacitor or the non-binary weighted capacitor, means for performing weighted averaging on a repeated number L of trials, where L is less than M; and means for generating an N-bit digital output.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 5 is a table of an example of an operation of a DAC circuit for 2 repeats (k=2) using the techniques of this disclosure.

DETAILED DESCRIPTION

Figure 1:
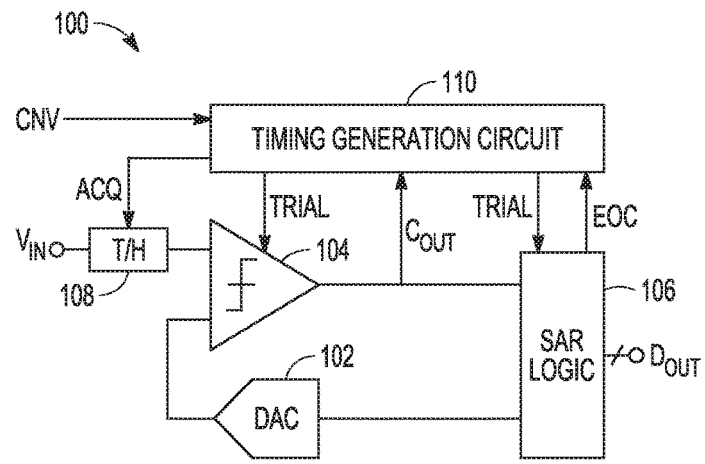
FIG. 1 is a block diagram of an example of an ADC circuit.

For a precision analog-to-digital converter (ADC) circuit, e.g., a successive approximation register (SAR) ADC, it can be desirable to calibrate its digital-to-analog converter (DAC) unit elements, e.g., capacitors for a capacitive DAC, as well as to suppress noise. However, as the target accuracy and the number of DAC unit elements increase, ADC calibration generally requires more power, die area, and time.

Using noise averaging techniques, noise power can decrease to 1/k while the signal power remains the same, where k is the number of averaging operations. Thus, the signal to noise ratio (SNR) can improve by a factor of k in the power domain. On the other hand, averaging cannot help to reduce distortion, so ADC non-linearity can limit ADC accuracy, e.g., signal to noise and distortion ratio (SNDR).

ADC non-linearity can be improved by digital calibration and averaging can improve SNDR. Digital calibration, however, can require additional circuits and operations for every DAC unit element used in a SAR ADC, for example. The overhead can increase as the required accuracy and the number of DAC unit elements increase.

This disclosure describes techniques to improve ADC circuit accuracy, e.g., for a SAR ADC circuit, efficiently in terms of power and die area. Some approaches for power efficient noise reduction techniques use multiple additional DAC unit elements of a DAC separate from the main DAC to suppress the conversion noise. As described in detail, the techniques of this disclosure can utilize a portion of the DAC circuit, e.g., redundancy bit(s) and the remaining lower bits or non-binary weighted bits for repeated bit trials, and can average the data from the repeated bit trials to suppress the noise from conversions. These techniques can reuse the existing DAC circuit for noise reduction to save power, die area, and reduce a cost of calibration by including fewer elements in the DAC circuit.

Because conversion noise is randomly distributed, averaging can reduce noise while maintaining the signal level and increasing the signal-to-noise ratio (SNR). Ideally, averaging the samples twice can increase SNR by 3 dB. To process an analog signal into a digital signal, a typical SAR ADC uses M trials per conversion, where M is greater than or equal to N, and where N is the resolution of the DAC circuit, e.g., ADC nominal output. If M is greater than N, then (M-N) trials can be used for redundancy to compensate for any error caused in early trials, such as a decision error from a comparator or a DAC settling error. The techniques of this disclosure can achieve the averaging effect with fewer trials (L trials) than normal SAR ADC trials (M trials), and the difference (M-N) can increase power efficiency and speed.

For a precision ADC, e.g., a SAR ADC, the comparator can dominate both the power and time, which are proportional to $M*(4^N)$, where M and N are the number of trials and the DAC resolution, respectively. The techniques of this disclosure are proportional to $(M+(k-1)*L)*(4^N)/k$ for the same level of accuracy, where L is the number of trials to be repeated and k is the number of times the L trials are repeated for a conversion. Although there can be more bit trials using the techniques of this disclosure, each comparison takes much less time and power, which can result in lower power and time for the entire conversion. For example, if M=13, N=12, k=-4, and L=3, the power consumption and time is reduced by 58%. The total comparison time and power approaches L/M as k increases.

FIG. 1 is a block diagram of an example of an ADC circuit. The ADC circuit 100 of FIG. 1 is a SAR ADC, the operation of which being known to those of ordinary skill in the art. The SAR ADC circuit 100 can include a digital-to-analog converter (DAC) circuit 102, e.g., a switched capacitor array, a comparator circuit 104, and SAR logic control and computation circuitry 106. The SAR ADC circuit can further include a track-and-hold circuit 108 to store a portion of an analog input signal "Vin" during an acquisition phase and a clock generation circuit 110 to provide appropriate timing for the circuit 100. Signal "CNV" represents an external acquisition trigger. When "CNV" goes high, the ADC stops its acquisition, e.g., signal "ACQ" goes low.

The SAR logic control circuitry 106 can control the operation of DAC 102 to generate a reference voltage for each bit trial. The SAR logic control and computation circuitry 106 initiates a sample of the input voltage Vin, initiates a first conversion of the sampled input voltage to a first set of bit values, such as using a first set of bit trials, and initiates a second conversion of a second sampled input voltage to a second set of bit values, such as using a second set of bit trials, and so forth.

The SAR logic control and computation circuitry 106 can include a state machine or other digital engine to perform functions such as progressing the ADC through different states of operation and to perform the calculations described. The SAR logic control and computation circuitry 106 can determine a final N-bit digital output value for the sampled input, and the final N-bit digital value can be made available as a digital output Dout.

In some example implementations, the DAC circuit 102 shown in FIG. 1 can be a capacitive DAC that includes an array of capacitors. The DAC circuit 102 can include at least N weighted circuit components, such as where the weight (e.g., capacitance value) of a particular weighted circuit component can be specified relative to that of one or more other weighted circuit components, with N being a positive integer. In certain examples, N is equal to sixteen and the weighted circuit components include sixteen capacitors (for example, with the sixteen capacitors including different multiples of a specified unit capacitor to obtain the weighting relative to each other).

A portion of the DAC circuit 102 can include a sampling DAC circuit 108. During a sampling phase, a clock generation circuit 110 can control operation of a track-and-hold circuit 108 to sample an analog input voltage Vin and hold it during a conversion phase.

Figure 2:
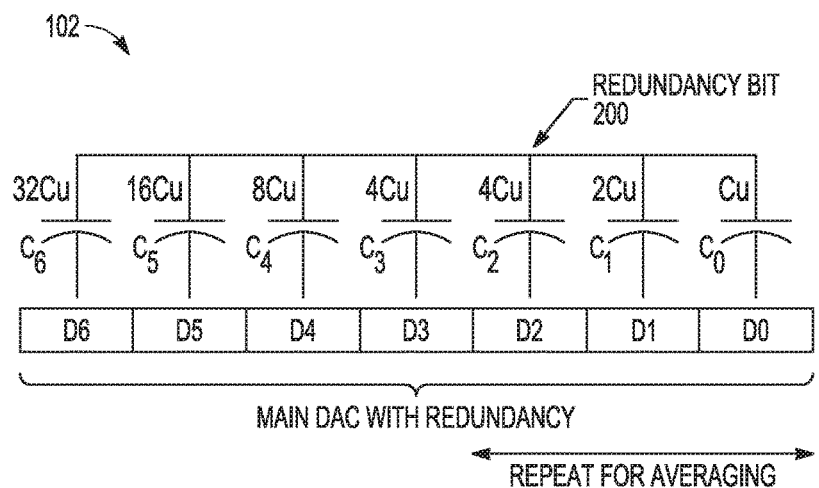
FIG. 2 is a conceptual diagram of an example of a portion of the DAC circuit of FIG. 1 that can implement various techniques of this disclosure.

FIG. 2 is a conceptual diagram of an example of a portion of the DAC circuit 102 of FIG. 1 that can implement various techniques of this disclosure. The DAC circuit 102 can include a number of weighted capacitors C6-C0, e.g., 32Cu, 16Cu, etc., representing most significant bits (MSBs) and least significant bits (LSBs) of a digital word. In the example shown in FIG. 2, the MSBs can include, for example, bits D6-D3 and the LSBs can include bits D2-D0.

Although the capacitors C6-C0 are shown as being binary-weighted, the techniques of this disclosure are not limited to binary-weighted configurations. Rather, the techniques of this disclosure are also applicable to non-binary weighted configurations, e.g., LSB weights that scale less than 2× per bit. In some examples, only some of the LSB capacitors in the DAC circuit can be non-binary weighted, e.g., D2 has a weight of 3.6 Cu and D1 has a weight of 1.9 Cu in a non-limiting example. In other examples, all of the capacitors of the DAC circuit can be non-binary weighted, e.g., each of D6-D1 can scale by less than 2× per bit with D0 having a weight of 1 Cu.

In addition, the techniques of this disclosure are not limited to a DAC circuit having a 7-bit resolution, e.g., C6-C0. The DAC circuit 102 of FIG. 2 is for purposes of explanation only. The techniques of this disclosure are applicable to DAC circuits having higher or lower resolution.

As seen in FIG. 2, the weighted capacitors include two 4 C capacitors, where the latter one is referred to as a redundant capacitor or redundant bit. The redundant capacitor need not be binary-weighted. Rather, the additional capacitor could be a non-binary weighted capacitor having a value of 2.2 C, as a non-limiting example. Unlike other approaches, the redundant or non-binary weighted additional capacitor 200 forms part of the main DAC rather than part of an extra DAC that is in addition to the main DAC. Further unlike other approaches, at least some of the LSB capacitors of the main DAC circuit and either the redundant capacitor(s) or the non-binary weighted capacitor are used to performing weighted averaging on a repeated number of bit-trials, as described below.

Figure 3:
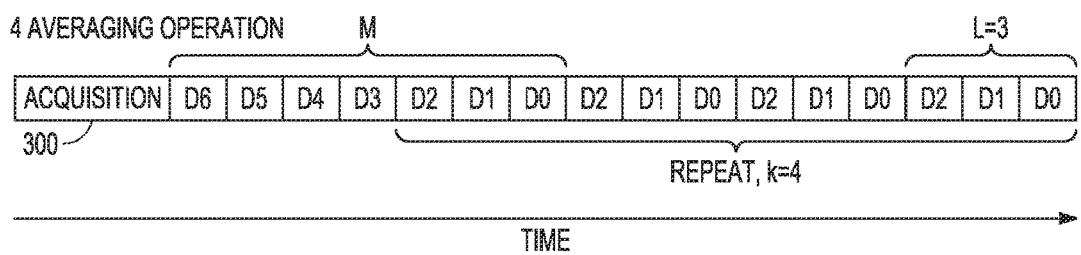
FIG. 3 is a conceptual diagram of an example of an averaging operation using the DAC circuit of FIG. 2 that can implement various techniques of this disclosure.

FIG. 3 is a conceptual diagram of an example of an averaging operation using the DAC circuit 102 of FIG. 2 that can implement various techniques of this disclosure. The DAC circuit 102 depicts an example of capacitor ratios for capacitors C6-C0 shown as 32Cu for C6, 16Cu for C5 . . . , and Cu for C0, where Cu represents a unit capacitance. As shown graphically in FIG. 3, after acquisition 300, bit-trials can determine bit D6, then bit D5, and so forth through bit D3. Then, bit-trials can be performed using the redundant bit D2 (or the non-binary weighted capacitor) of the main DAC of FIG. 2 and at least some of the LSB capacitors, e.g., bits D1 and D0. The bit-trials can be repeated for bits D2-D0 and the results can be averaged to suppress the noise from conversions.

In some examples, these techniques can result in a 3 dB/octave SNR improvement with (M+(k−1)*L) bit-trials, where M is the number of weighted capacitors, k is a number of repeat operations, and L is the number of trials for each of the repeat operations. In the non-limiting example shown in FIG. 3, M=7 (D6-D0), k=4 (D2-D0 are repeated 4 times, or a 4-averaging operation), and L=3 (D2-D0).

The (M+(k−1)*L) bit-trials are less than the (k*M) bit-trials of other approaches and can improve the ADC power efficiency or Shreier's figure of merits (FoMs). As k increases, the power efficiency improvement approaches to M/L.

Using the DAC structure of FIG. 2, where the DAC circuit has at least one bit redundancy or using non-binary weight bits totaling more than the weight of D3 to correct any errors caused in its earlier trials, the SAR logic control circuitry, e.g., SAR logic control circuitry 106, can repeat the redundancy bit, e.g., bit D2 of FIG. 3, and the lower bit trials, e.g., bits D1-D0, for averaging and can reconstruct the ADC output Dout as shown below in Equation 1:

$$D_{out} = \sum_{i=L}^{M-1} D(i)W(i) + \frac{1}{k}\sum_{j=1}^{k}\sum_{i=0}^{L-1} D(i)W(i) \quad \text{Equation 1}$$

where D(i) is the bit trial comparison result (e.g., two states such as 0, 1, where low=0 and high=1), W(i) is a weight of a capacitor of the weighted capacitors, M is the number of weighted capacitors (e.g., D6-D0 in in FIG. 3), k is a number of repeat operations (e.g., k is 4 in FIG. 3), and L is the number of trials for each of the repeat operations (e.g., L is 3 in FIG. 3). As seen in Equation 1, the second term of Dout is a weighted averaging term. In other example implementations, three states can be used, e.g., −0.5/0/+0.5.

Figure 4:
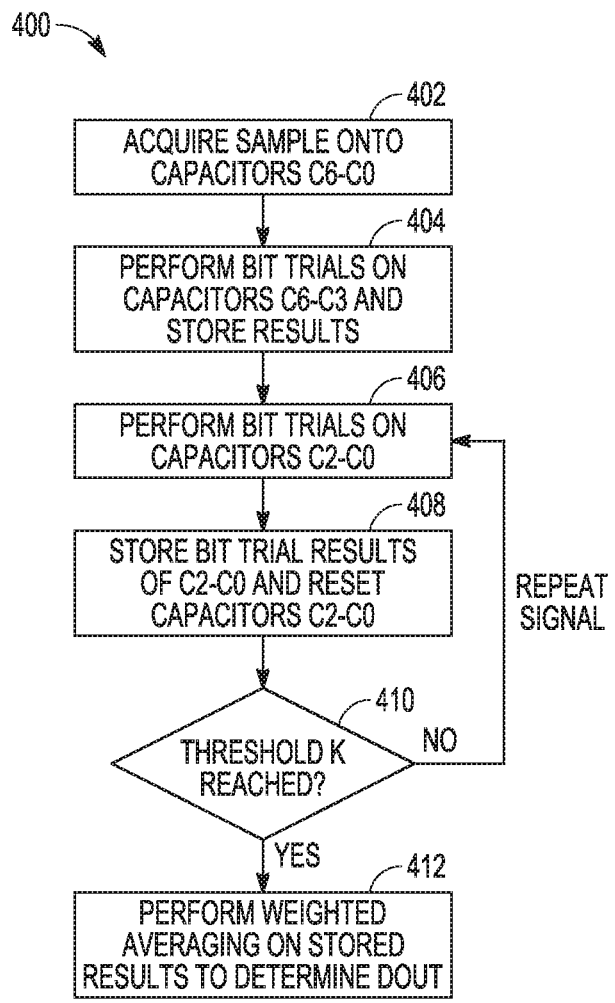
FIG. 4 is a flow diagram of an example of a method that can implement various techniques of this disclosure.

FIG. 4 is a flow diagram of an example of a method 400 that can implement various techniques of this disclosure. The method 400 refers specifically to the non-limiting examples shown in FIGS. 2 and 3.

At block 402, the ADC can acquire a sample of an analog input signal onto a main capacitive digital-to-analog converter (DAC) circuit, where the main DAC circuit includes weighted capacitors representing most significant bits (MSBs) and least significant bits (LSBs), and wherein the weighted LSB capacitors include at least one redundant capacitor or non-binary weighted capacitor. For example, the SAR logic and control circuitry 106 of FIG. 1 can control the track-and-hold circuit 108 to acquire a sample onto the DAC circuit 102. The DAC circuit 102 can include weighted capacitors representing most significant bits (MSBs) and least significant bits (LSBs), where the weighted LSB capacitors include at least one redundant capacitor or non-binary weighted capacitor, similar to FIG. 2.

At block 404, the method 400 can include performing bit-trials on a first subset of capacitors C6-C3, e.g., the MSB bits, and storing the results D6-D3. For example, the SAR logic and control circuitry 106 of FIG. 1 can perform the bit-trials on capacitors C6-C3 and store the result in a memory circuit.

At block 406, the method 400 can include performing bit-trials on a second subset of capacitors C2-C0, e.g., at least some of the LSBs. For example, the SAR logic and control circuitry 106 of FIG. 1 can perform the bit-trials on capacitors C2-C0.

At block 408, the method 400 can include storing the results of bit-trial capacitors C2-C0, and then resetting the capacitors' control signals D2-D0, where resetting can include discharging the bottom plates of the capacitors to their initial state. For example, the SAR logic and control circuitry 106 of FIG. 1 can store the result in a memory circuit and control various switches to discharge the bottom plates of the capacitors C2-C0 to their initial state.

At block 410, the method 400 can include determining whether a threshold number k of repetitions has been reached. If the threshold k has not been reached ("NO" branch of decision block 410), then the method can go back to block 406 and perform additional bit trials on capacitors C2-C0. In this manner, the ADC can repeatedly perform the number L of trials on at least one of the capacitors representing the LSBs. If the threshold k has been reached ("YES" branch of decision block 410), then the method can go proceed to block 412.

At block 412, the method 400 can include performing weighted averaging on the stored results to determine digital Dout. For example, the SAR logic and control circuit 106 of FIG. 1 can determine a weighted average of the stored results for D2-D0 using the second term of Equation 1 above, determine a weighted sum using the first term of Equation 1, and then determine Dout.

More particularly, for each of the stored results of the bit trials of the second subset, e.g., the LSBs, the SAR logic and control circuit 106 of FIG. 1 can multiply a bit-weight of a capacitor in the second subset and a corresponding result of the bit-trial to generate a first set of products and determine an average of the first set of products. Then, for each of the stored results of the bit trials on the first subset, e.g., the MSBs, the SAR logic and control circuit 106 of FIG. 1 can multiply a bit-weight of a capacitor in the first subset and a corresponding result of the bit-trial to generate a second set of products, and sum the second set of products and the average of the first set of products to generate the N-bit digital output Dout.

FIG. 5 is a table of an example of an operation of a DAC circuit for 2 repeats (k=2) using the techniques of this disclosure. The table 500 includes seven (7) columns 502-514 each depicting a status of bit-trial capacitors D6-D0, respectively. The twelve (12) rows 518-540 depict the successive operations performed on the bit-trial control signals D6-D0.

In row 518, the bit-trial control signals D6-D0 are reset or initialized at the start of the bit-trial operations. For example, using two states (0 and 1), control signals D6-D0 can be set to midscale with D6 set to 1 and D5-D0 set to 0.

In rows 520-532, the SAR logic and control circuit 106 of FIG. 1 successively determines bit-trial capacitors D6-D3 and bit-trial capacitors $D_12$-$D_10$, where the subscript "1" represents the first of the two repeat operations, and stores the results.

In row 534, the SAR logic and control circuit 106 of FIG. 1 resets bit-trial control signals D2-D0 by discharging their bottom plate capacitor to their initial state, e.g., the state shown in row 534 with D2-D0=0.

Then, in rows 536-540, the SAR logic and control circuit 106 of FIG. 1 successively determines bit-trial capacitors bit-trial capacitors D22-D20, where the subscript "2" represents the second of the two repeat operations, and stores the results.

Then, the SAR logic and control circuit 106 of FIG. 1 can perform weighted averaging on the stored results to determine digital Dout. For example, the SAR logic and control circuit 106 of FIG. 1 can determine a weighted average of the stored results for D2-D0 using the second term of Equation 1 above, determine a weighted sum using the first term of Equation 1, and then determine Dout.

Figure 6:
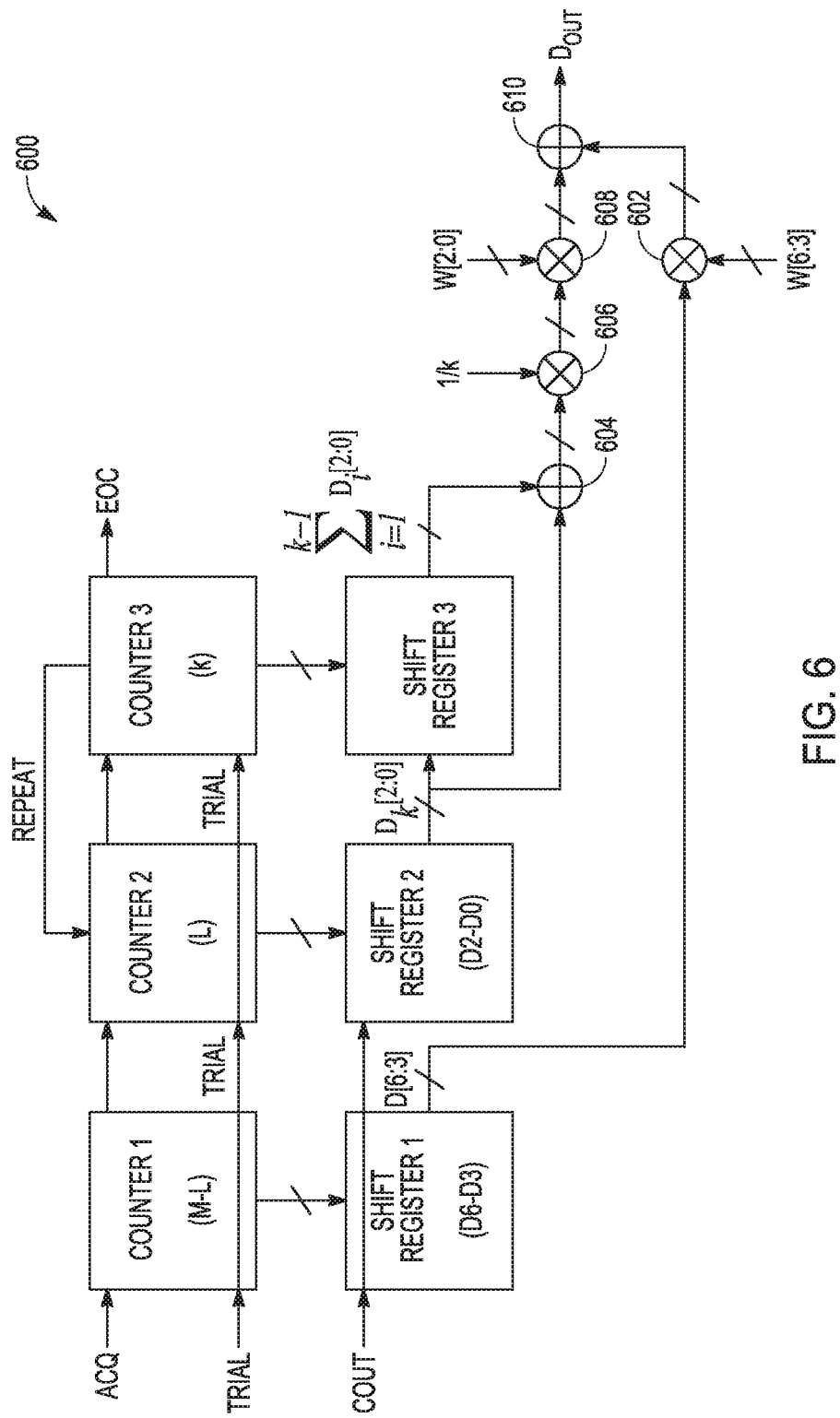
FIG. 6 is a block diagram of an example of a logic circuit that can be used to implement various techniques of this disclosure.

FIG. 6 is a block diagram of an example of a logic circuit 600 that can be used to implement various techniques of this disclosure. For example, the logic circuit 600 of FIG. 6 can form part of the SAR logic control circuitry 106 of FIG. 1 and can implement Equation 1 to perform the weighted averaging techniques of this disclosure and reconstruct the ADC output Dout. The non-limiting example shown in FIG. 6 is described with respect to the DAC circuit 102 of FIG. 2 and the averaging operation shown in FIG. 3.

The logic circuit 600 can include, for example, three (3) counters (Counter 1-Counter 3) and three (3) shift registers (Shift Register 1-Shift Register 3), as shown. The logic circuit 600 can receive three (3) signals including an acquisition signal "acq", a bit-trial (clock) signal "trial", and a comparator (output) signal "cout".

As indicated above, (M+(k−1)*L) bit-trials are needed to implement the weighted averaging techniques of Equation 1. Before switching to the repeat operation, Counter 1 can count (M-L) trials. Counter 2 can count the L bit-trials and Counter 3 can count the k repeat operation of L bit trials, where M is the number of weighted capacitors, k is a number of repeat operations, and L is the number of trials for each of the repeat operations. To increase the number of averaging operations, the Counter 3 "k" can be increased.

Each of Shift Register 1 and Shift Register 2 receive the comparator output signal "Cout", and each of Shift Register 1-Shift Register 3 receive the output of Counter 1-Counter 3, respectively. Shift Register 1 can capture the D6-D3 bit trial results. Shift Register 2 can capture D2-D0 bit trial results (of each repeat operation), which can be updated to Shift Register 3.

At the end of a conversion, Shift Register 1 can pass the bit trial results D6-D3, e.g., MSB results, to a first multiplier circuit 602. Shift Register 2 stores the bit trial results of the last repeat operation for D2-D0, and Shift Register 3 stores the bit trial results of the next-to-last repeat operation for D2-D0 until the results from Shift Register 2 propagate to Shift Register 3.

The first multiplier circuit 602 can receive and multiply the bit weights W6-W3 of bits D6-D3 and the D6-D3 bit trial results from Shift Register 1 to generate the first term of Dout in Equation 1, where W6-W0 are 32, 16, 8, 4, 4, 2, 1, respectively, in this non-limiting specific example.

The D2-D0 outputs of Shift Register 2 and Shift Register 3 can be summed separately using a first adder circuit 604 and then divided by k for averaging. That is, the output of the first adder circuit 604 can be received by a second multiplier circuit 606 and multiplied by 1/k. Then, a third multiplier circuit 608 can receive and multiply the bit weights W2-W0 of bits D2-D0 and the output of the second multiplier circuit 606 to generate the second term of Dout in Equation 1, which includes the weighted averaging. Finally, a second adder circuit 610 can sum the outputs of the first multiplier circuit 602 and third multiplier circuit 608 to generate Dout (data reconstruction).

Figure 7:
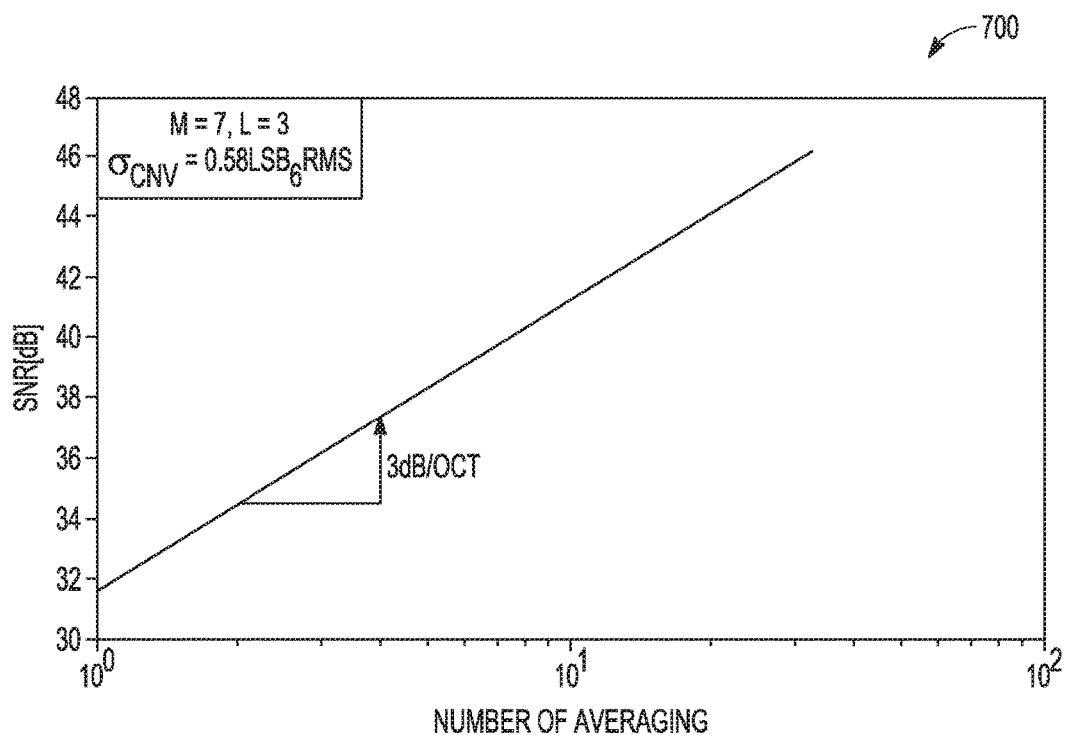
FIG. 7 is a graph depicting simulation results for SNR against the number of averaging using the techniques of this disclosure.

FIG. 7 is a graph 700 depicting simulation results for SNR against the number of averaging using the techniques of this disclosure. The simulation depicts results using a DAC structure similar to FIG. 2, with M=7, L=3. The conversion noise is 0.58 LSBrms in 6 bit resolution (0.58 $LSB_6$ rms).

The results show a 3 dB/octave SNR improvement with (M+(k−1)*L) bit trials, which is smaller than k*M and improves the ADC power efficiency or Shreier's figure of merits (FoMs). As k increases, the power efficiency improvement approaches to M/L. The averaging effect can depend on the conversion noise level and correction range of the repeating operation.

Figure 8:
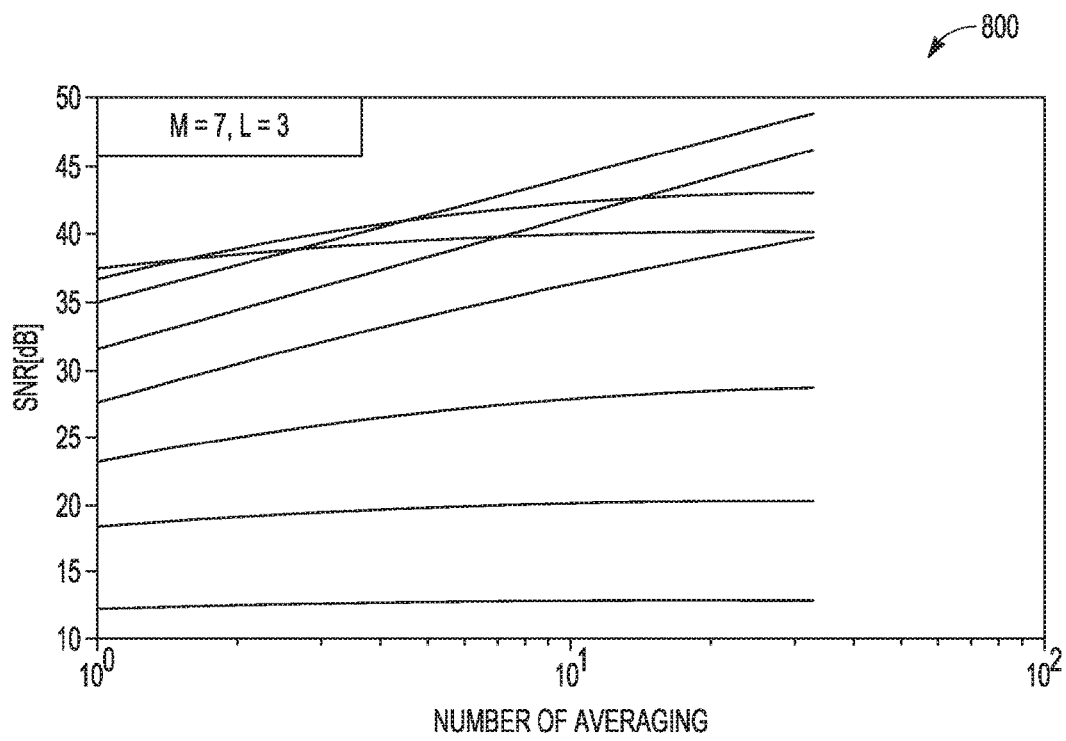
FIG. 8 is a graph depicting simulation results for SNR against the number of averaging with different conversion noise levels using the techniques of this disclosure.

FIG. 8 is a graph 800 depicting simulation results for SNR against the number of averaging with different conversion noise levels using the techniques of this disclosure. The simulation depicts results using a DAC structure similar to FIG. 2, with M=7, L=3.

Figure 9:
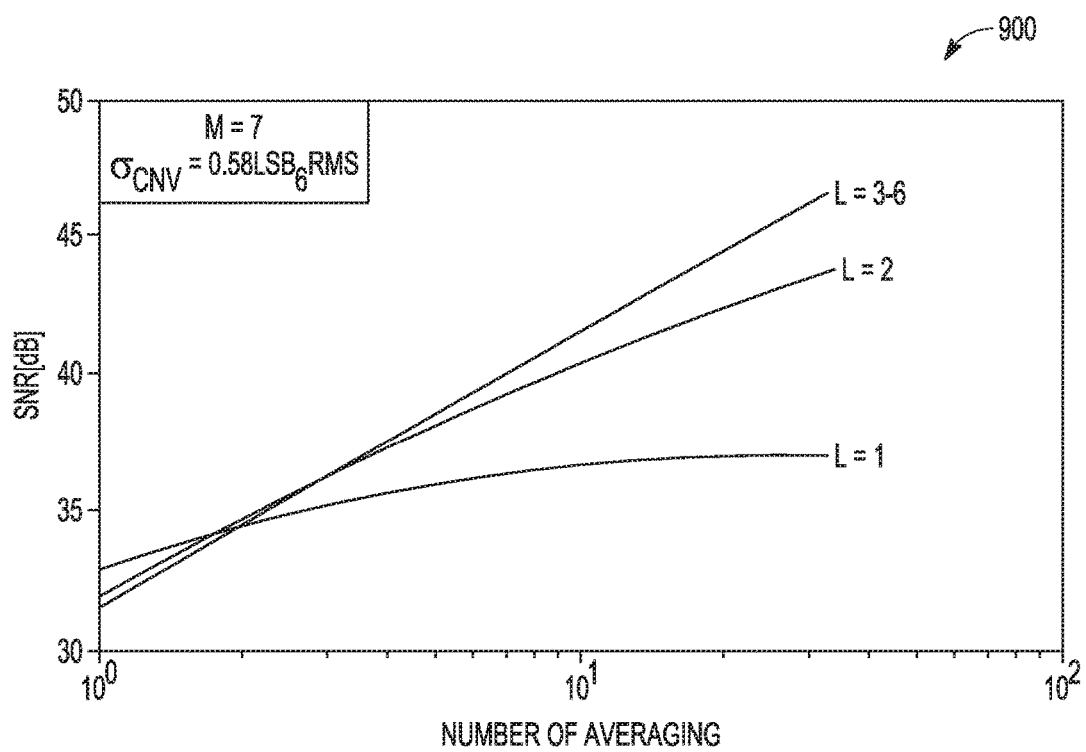
FIG. 9 is a graph depicting simulation results for SNR against the number of averaging with different numbers of repeat trials using the techniques of this disclosure.

FIG. 9 is a graph 900 depicting simulation results for SNR against the number of averaging with different numbers of repeat trials using the techniques of this disclosure. The simulation depicts results using a DAC structure similar to FIG. 2, with M=7 and a sweep of L=1 to 6, where L is the number of trials for each of the repeat operations (e.g., L is 3 in FIG. 3). As seen in FIG. 9, the SNR improves as L increases from 1 to 3 and the SNR is similar for L=3 to 6.

VARIOUS NOTES

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A method of operating an analog-to-digital converter (ADC) circuit to reduce noise, the method comprising:
    acquiring a sample of an analog input signal onto a capacitive digital-to-analog converter (DAC) circuit, wherein the DAC circuit includes weighted capacitors representing most significant bits (MSBs) and least significant bits (LSBs);
    performing, by the DAC circuit, a number M of bit-trials to convert the sample into an N-bit representation;
    performing, by at least some of the weighted LSB capacitors, weighted averaging on a repeated number L of trials, where L is less than M; and
    generating an N-bit digital output.

2. The method of claim 1, wherein the number L of trials includes the last bit trials of a conversion.

3. The method of claim 1, wherein performing a number M of bit-trials to convert the sample into an N-bit representation includes:
    performing bit-trials on a first subset of the weighted capacitors and storing results of the bit-trials on the first subset, the method further comprising
    until a number k of repetitions is reached, repeatedly performing the number L of trials on a second subset of the weighted capacitors and storing results of the bit-trials of the second subset.

4. The method of claim 3, wherein performing bit-trials on a first subset of the weighted capacitors and storing results of the bit-trials on the first subset includes:
    performing bit-trials on at least one of the capacitors representing the MSBs.

5. The method of claim 3, wherein repeatedly performing the number L of trials on a second subset of the weighted capacitors includes:
    repeatedly performing the number L of trials on at least some of the weighted LSB capacitors including the at least one redundant capacitor or non-binary weighted capacitor.

6. The method of claim 3, wherein performing a weighted averaging operation on a number L of trials includes:
    for each of the stored results of the bit trials in the second subset, multiplying a bit-weight of a capacitor in the second subset and a corresponding result of the bit-trial to generate a first set of products, and
    determining an average of the first set of products.

7. The method of claim 6, wherein generating an N-bit digital output includes:
    for each of the stored results of the bit trials in the first subset, multiplying a bit-weight of a capacitor in the first subset and a corresponding result of the bit-trial to generate a second set of products; and
    summing the second set of products and the average of the first set of products to generate the N-bit digital output.

8. The method of claim 1, wherein performing a weighted averaging operation on a number L of trials and generating an N-bit digital output includes calculating the N-bit digital output (Dout) from Equation 1:

$$D_{out} = \sum_{i=L}^{M-1} D(i)W(i) + \frac{1}{k}\sum_{j=1}^{k}\sum_{i=0}^{L-1} D(i)W(i), \quad \text{Eq. (1)}$$

wherein D(i) is a bit-trial result, W(i) is a weight of a capacitor of the weighted capacitors, M is the number of weighted capacitors, k is a number of repeat operations, and L is the number of trials for each of the repeat operations.

9. The method of claim 1, wherein the performing a number M of bit-trials to convert the sample into an N-bit representation includes:
    performing successive approximation register (SAR) bit-trials to convert the sample into an N-bit representation.

10. The method of claim 1, wherein the weighted LSB capacitors include at least one redundant capacitor or non-binary weighted capacitor.

11. An analog-to-digital converter (ADC) circuit for reducing noise, the circuit comprising:
a digital-to-analog converter circuit (DAC) configured to sample an analog input signal, wherein the DAC circuit includes weighted capacitors representing most significant bits (MSBs) and least significant bits (LSBs); and
control circuitry configured to:
perform a number M of bit-trials to convert the sample into an N-bit representation;
perform, by at least some of the weighted LSB capacitors, weighted averaging on a repeated number L of trials, where L is less than M; and
generate an N-bit digital output.

12. The circuit of claim 11, wherein the number L of trials includes the last bit trials of a conversion.

13. The circuit of claim 11, wherein the weighted capacitors include a first subset and a second subset, and wherein the control circuit configured to perform a number M of bit-trials to convert the sample into an N-bit representation is configured to:
perform bit-trials on the first subset of the weighted capacitors and store results of the bit-trials on the first subset, the method further comprising
until a number k of repetitions is reached, repeatedly perform the number L of trials on the second subset of the weighted capacitors and storing results of the bit-trials of the second subset.

14. The circuit of claim 13, wherein the control circuit configured to perform bit-trials on a first subset of the weighted capacitors and storing results of the bit-trials on the first subset is configured to:
perform bit-trials on at least one of the capacitors representing the MSBs.

15. The circuit of claim 13, wherein the control circuit configured to repeatedly perform the number L of trials on a second subset of the weighted capacitors is configured to:
repeatedly perform the number L of trials on at least some of the capacitors representing the LSBs including the at least one redundant capacitor or non-binary weighted capacitor.

16. The circuit of claim 13, wherein the control circuit configured to perform a weighted averaging operation on a number L of trials is configured to:
for each of the stored results of the bit trials of the second subset, multiply a bit-weight of a capacitor in the second subset and a corresponding result of the bit-trial to generate a first set of products; and
determine an average of the first set of products.

17. The circuit of claim 16, wherein the control circuit configured to generate an N-bit digital output is configured to:
for each of the stored results of the bit trials of the first subset, multiply a bit-weight of a capacitor in the first subset and a corresponding result of the bit-trial to generate a second set of products; and sum the second set of products and the average of the first set of products to generate the N-bit digital output.

18. The circuit of claim 11, wherein the control circuit configured to perform a weighted averaging operation on a number L of trials and generate an N-bit digital output includes calculating the N-bit digital output (Dout) from Equation (1):

$$D_{out} = \sum_{i=L}^{M-1} D(i)W(i) + \frac{1}{k}\sum_{j=1}^{k}\sum_{i=0}^{L-1} D(i)W(i), \quad \text{Equation (1)}$$

wherein D(i) is a bit-trial result, W(i) is a weight of a capacitor of the weighted capacitors, M is the number of weighted capacitors, k is a number of repeat operations, and L is the number of trials for each of the repeat operations.

19. The circuit of claim 11, wherein the control circuit configured to perform a number M of bit-trials to convert the sample into an N-bit representation is configured to:
perform successive approximation register (SAR) bit-trials to convert the sample into an N-bit representation.

20. The circuit of claim 11, wherein the weighted LSB capacitors include at least one redundant capacitor or non-binary weighted capacitor.

21. An analog-to-digital converter (ADC) circuit for reducing noise, the circuit comprising:
a digital-to-analog converter circuit (DAC) configured to sample an analog input signal, wherein the DAC circuit includes weighted capacitors representing most significant bits (MSBs) and least significant bits (LSBs);
means for performing a number M of bit-trials to convert the sample into an N-bit representation;
means for performing, by at least some of the weighted LSB capacitors, weighted averaging on a repeated number L of trials, where L is less than M; and
means for generating an N-bit digital output.

22. The circuit of claim 21, wherein the means for performing a weighted averaging operation on a number L of trials and means for generating an N-bit digital output includes means for calculating the N-bit digital output (Dout) from Equation (1):

$$D_{out} = \sum_{i=L}^{M-1} D(i)W(i) + \frac{1}{k}\sum_{j=1}^{k}\sum_{i=0}^{L-1} D(i)W(i), \quad \text{Equation (1)}$$

wherein D(i) is a bit-trial result, W(i) is a weight of a capacitor of the weighted capacitors, M is the number of weighted capacitors, k is a number of repeat operations, and L is the number of trials for each of the repeat operations.

23. The circuit of claim 21, wherein the weighted LSB capacitors include at least one redundant capacitor or non-binary weighted capacitor.

* * * * *

UNITED STATES PATENT AND TRADEMARK OFFICE
CERTIFICATE OF CORRECTION

PATENT NO. : 10,447,289 B1
APPLICATION NO. : 16/009923
DATED : October 15, 2019
INVENTOR(S) : Shikata et al.

Page 1 of 1

It is certified that error appears in the above-identified patent and that said Letters Patent is hereby corrected as shown below:

In the Claims

In Column 10, Line 15, in Claim 3, after "comprising", insert --:--

In Column 10, Line 38, in Claim 6, delete "products," and insert --products;-- therefor In Column 10, Line 51, in Claim 8, delete "(Dout)" and insert --($D_{out}$)-- therefor In Column 11, Line 26, in Claim 13, after "comprising", insert --:--

In Column 12, Line 6, in Claim 18, delete "(Dout)" and insert --($D_{out}$)-- therefor In Column 12, Line 43, in Claim 22, delete "(Dout)" and insert --($D_{out}$)-- therefor Signed and Sealed this
Nineteenth Day of May, 2020

Andrei Iancu
*Director of the United States Patent and Trademark Office*